(12) United States Patent
Nakakuki

(10) Patent No.: US 7,122,745 B2
(45) Date of Patent: Oct. 17, 2006

(54) CIRCUIT BOARD HAVING METALLIC PLATE, PRINTED CIRCUIT BOARD AND FLEXIBLE CIRCUIT BOARD

(75) Inventor: Kiyoshi Nakakuki, Yokkaichi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/934,455

(22) Filed: Sep. 7, 2004

(65) Prior Publication Data

US 2005/0061544 A1    Mar. 24, 2005

(30) Foreign Application Priority Data

Sep. 18, 2003    (JP)    ............................. 2003-326509

(51) Int. Cl.
*H01R 12/04*    (2006.01)
(52) U.S. Cl. ...................................... 174/261
(58) Field of Classification Search ................ 174/254, 174/255, 259–261
See application file for complete search history.

(56) References Cited

U.S. PATENT DOCUMENTS

| | | | | |
|---|---|---|---|---|
| 5,468,994 A | * | 11/1995 | Pendse | ........................ 257/693 |
| 6,388,201 B1 | * | 5/2002 | Yamato et al. | ............... 174/255 |
| 6,501,031 B1 | * | 12/2002 | Glovatsky et al. | ........... 174/262 |
| 6,600,427 B1 | * | 7/2003 | Simon et al. | ........... 340/815.49 |
| 6,818,837 B1 | * | 11/2004 | Okami | ........................ 174/260 |
| 2002/0134584 A1 | * | 9/2002 | Higuchi et al. | ............. 174/264 |
| 2002/0186551 A1 | * | 12/2002 | Murowaki et al. | .......... 361/752 |
| 2002/0189862 A1 | * | 12/2002 | Miyake et al. | ............... 174/262 |

FOREIGN PATENT DOCUMENTS

JP    A-2003-51651    2/2003

* cited by examiner

Primary Examiner—Kamand Cuneo
Assistant Examiner—Yuriy Semenenko
(74) Attorney, Agent, or Firm—Posz Law Group, PLC

(57) ABSTRACT

A circuit board includes: a metallic plate having an opening; a flexible circuit board disposed on a first surface of the metallic plate; and a printed circuit board disposed in the opening of the metallic plate. The flexible circuit board is protruded to the opening of the metallic plate so that a part of the flexible circuit board is bonded to the printed circuit board. The printed circuit board includes a first land disposed on a first surface of the printed circuit board, which is disposed on the first surface of the metallic plate. The flexible circuit board includes a second land disposed on a first surface of the flexible circuit board, which is opposite to the metallic plate. The first and second lands are electrically connected each other with a connecting member.

30 Claims, 7 Drawing Sheets

CIRCUIT BOARD HAVING METALLIC PLATE, PRINTED CIRCUIT BOARD AND FLEXIBLE CIRCUIT BOARD

CROSS REFERENCE TO RELATED APPLICATION

This application is based on Japanese Patent Application No. 2003-326509 filed on Sep. 18, 2003, the disclosure of which is incorporated herein by reference.

FIELD OF THE INVENTION

The present invention relates to a circuit board having a metallic plate, a printed circuit board and a flexible circuit board.

BACKGROUND OF THE INVENTION

A circuit board having a metallic plate as a substrate and a flexible circuit board is disclosed in Japanese Patent Application Publication No. 2003-51651. The flexible circuit board is bonded on the metallic plate directly so that the circuit board has excellent heat conductivity and high rigidity. The flexible circuit board is made of thermoplastic resin. The circuit board is used, for example, for a meter board (i.e., a combination meter) in an instrument panel of an automotive vehicle. In this case, the circuit board has following problems.

Although the meter board of the vehicle works as a meter, it is required for the meter board to have a novel and impressive design. Therefore, each meter board has a different design corresponding to a type of the vehicle.

In general, it is required for the meter board to become larger, because of the design. For example, positioning of a motor for driving an indicator and an illumination lamp for the indicator is determined on the basis of the design; and therefore, the meter board becomes larger. Further, on the meter board, a control circuit for controlling the motor and the lamp is mounted. Specifically, the control circuit is mounted on an unused space in the meter board.

To comply with both conditions of the large meter board and the positioning of the control circuit, the circuit board includes multiple flexible circuit boards mounted on the metallic plate. Therefore, the area of the flexible circuit board becomes larger. Accordingly, a manufacturing cost becomes higher. Further, since the meter board has a different design corresponding to a type of the vehicle, so that a man-hour for designing the circuit board becomes larger.

SUMMARY OF THE INVENTION

In view of the above-described problem, it is an object of the present invention to provide a large circuit board having excellent heat conductivity and high rigidity. Further, the circuit board is manufactured at low cost and provides to reduce a man-hour for designing a circuit positioning.

A circuit board includes: a metallic plate having an opening; a flexible circuit board disposed on a first surface of the metallic plate; and a printed circuit board disposed in the opening of the metallic plate. The flexible circuit board is protruded to the opening of the metallic plate so that a part of the flexible circuit board is bonded to the printed circuit board. The printed circuit board includes a first land as a part of a conductor pattern, the first land disposed on a first surface of the printed circuit board, which is disposed on the first surface of the metallic plate. The flexible circuit board includes a second land as a part of a conductor pattern, the second land disposed on a first surface of the flexible circuit board, which is opposite to the metallic plate. The first and second lands are electrically connected each other with a connecting member.

The above circuit board can be a large circuit board, and has excellent heat conductivity and high rigidity. Further, the circuit board is manufactured at low cost and provides to reduce a man-hour for designing a circuit positioning.

Preferably, the circuit board provides a plurality of electric circuits, which are classified with functions so that the electric circuits are divided into a plurality of blocks including an individual circuit block and a common circuit block. The individual circuit block has a conductor pattern of the electric circuits, which is changeable in accordance with a design of the circuit board. The common circuit block has a common conductor pattern of the electric circuits, which is common even when the design of the circuit board is changed. The flexible circuit board provides the individual circuit block. The printed circuit board provides the common circuit block.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1A:
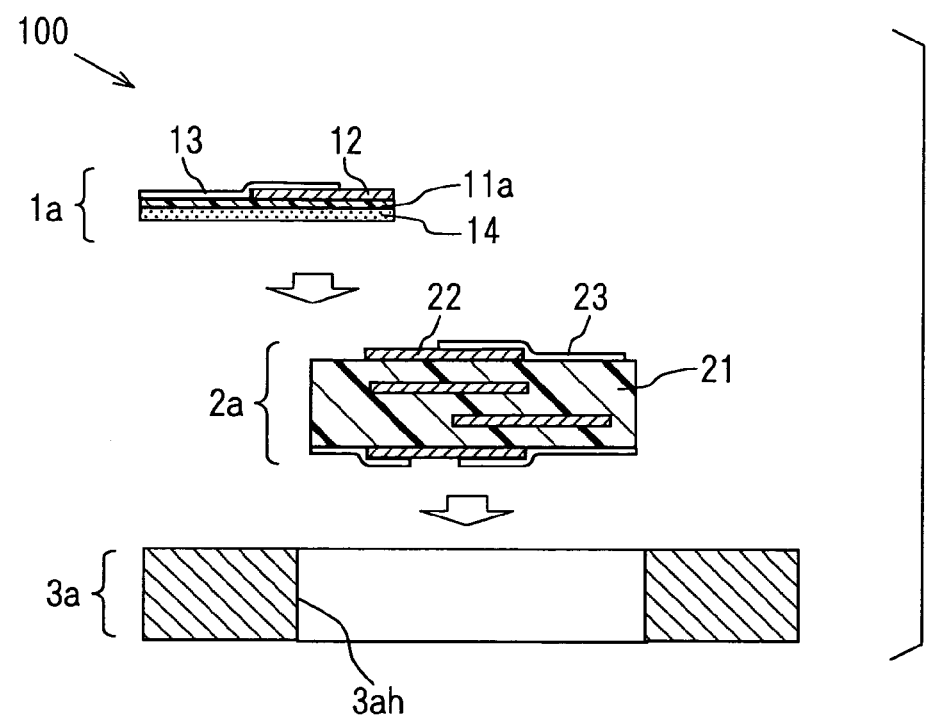
FIG. 1A is an exploded cross sectional view showing a circuit board.
Figure 1B:
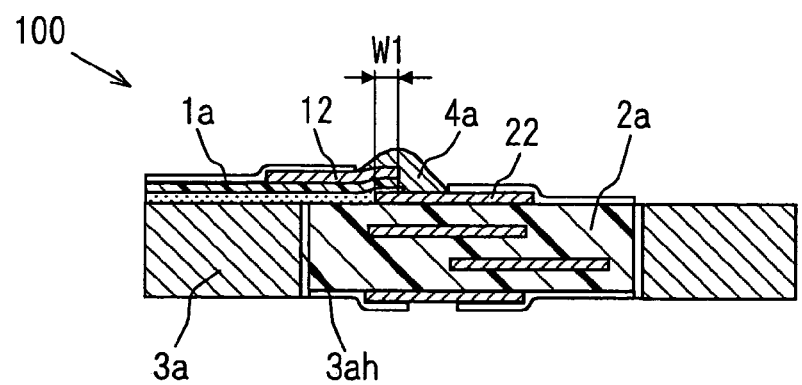
FIG. 1B is a cross sectional view showing the circuit board according to a first embodiment of the present invention.

FIG. 1A explains a method for manufacturing a circuit board 100, and FIG. 1B shows the circuit board 100, according to a first embodiment of the present invention. The circuit board 100 includes a metallic plate 3a, a flexible circuit board 1a and a printed circuit board 2a. The metallic plate 3a works as a substrate (i.e., a base). The flexible circuit board 1a is bonded to one side of the metallic plate 3a. The printed circuit board 2a is mounted and inserted into an opening 3ah formed in the metallic plate 3a, and bonded to a part of the flexible circuit board 1a, which is protruded to the opening 3ah.

As shown in FIG. 1A, the flexible circuit board 1a in the circuit board 100 includes a film base 11a, an adhesion layer 14, and a land 12. The adhesion layer 14 is formed on one side of the film base 11a, and used for a lay-up process (i.e., a lamination process). The land is used for a connection, is a part of a conductor pattern formed on the flexible circuit board 1a, is disposed on the other side of the flexible circuit board 1a opposite to the adhesion layer 14, and is exposed on the surface of the flexible circuit board 1a. The film base 11a is made of thermosetting resin. Specifically, the film base 11a is made of poly imide, PEN (i.e., poly ethylene-2,6-naphthalene dicarboxylate), PET (i.e., poly ethylene telephthalate), or the like, which are used for a circuit substrate in general. The adhesion layer 14 is made of thermosetting adhesive such as silicone series material or epoxy series material. The flexible circuit board 1a having the film base 11a made of thermosetting resin has high dimensional accuracy, so that the flexible circuit board 1a is generally and widely used, and is available easily.

The printed circuit board 2a in the circuit board 100 is a multi-layered printed circuit board having multiple conductor patterns embedded in an insulation substrate 21. A part of the conductor patterns is exposed on the surface of the insulation substrate 21 so that the land 22 is formed. The printed circuit board 2a can be made of a glass epoxy board (i.e., FR4, which is a glass fiber epoxy laminate), which is used for a circuit board in general. A solder resist layer 13 is formed on the film base 11a and the land 12. Another solder resist layer 23 is formed on the insulation substrate 21. The solder resist layers 13, 23 are made of insulation resin.

As shown in FIG. 1B, the printed circuit board 2a is inserted in the opening 3ah of the metallic plate 3a, and the printed circuit board 2a with the metallic plate 3a is bonded to the flexible circuit board 1a. The adhesion layer 14 of the flexible circuit board 1a is heated and pressurized up to a melting temperature of the adhesive so that the printed circuit board 2a with the metallic plate 3a is bonded to the flexible circuit board 1a. When the adhesive is made of silicone series material or epoxy series material, preferably, the heating temperature of the adhesive is set to be 80° C. to 150° C. After the printed circuit board 2a with the metallic plate 3a is bonded to the flexible circuit board 1a, the land 22 of the printed circuit board 2a and the land 12 of the flexible circuit board 1a are strongly bonded with a solder 4a as an electric connection member.

In the circuit board 100, the surface of the metallic plate 3a and the surface of the printed circuit board 2a are almost same height. Therefore, a height difference (i.e., a step) between the land 22 of the printed circuit board 2a and the land 12 of the flexible circuit board 1a is small, so that the connection between them can be easily performed by the solder 4a. Accordingly, the reliability of the connection between the lands 12, 22 is improved. The land 22 of the printed circuit board 2a and the land 12 of the flexible circuit board 1a are overlapped at an overlapping portion W1. The overlapping portion W1 is provided by projecting a part of the land 12 of the flexible circuit board 1a to the land 22 of the printed circuit board 2a in a vertical direction perpendicular to the metallic plate 3a. Thus, since the lands 12, 22 are approximated and overlapped each other so that the overlapping portion W1 is formed, the connection can be easily performed with the solder 4a. Accordingly, the reliability of the connection is improved.

The circuit board 100 has following merits. For example, a circuit block having a complicated electric circuit such as a control circuit is formed as one unit in the printed circuit board 2a, which has small and multi-layered construction. Then, the printed circuit board 2a is inserted in the opening 3ah of the metallic plate 3a. Thus, the printed circuit board 2a having the complicated circuit construction is small and multi-layered so that the printed circuit board 2a can be manufactured at low cost. Further, the complicated circuit block including the control circuit is formed as one unit so that a man-hour for designing a circuit positioning can be reduced. On the other hand, since the flexible circuit board 1a includes a circuit block having comparatively simple circuit construction, the flexible circuit board 1a can be a single layer circuit board. Therefore, the flexible circuit board 1a can be manufactured at low cost even when the flexible circuit board 1a becomes a large circuit board. Since the printed circuit board 2a is inserted in the opening 3ah, the dimensions of the circuit board 100 as a whole are defined by the dimensions of the metallic plate 3a. Therefore, the circuit board 100 does not become larger.

Thus, the circuit board 100 having excellent heat conductivity and high rigidity becomes a large circuit board, and is manufactured at low cost and provides to reduce the man-hour for designing a circuit positioning.

The circuit board 100 is suitably used for a meter board (i.e., a combination meter) in an instrument panel of an automotive vehicle. Here, the meter board has a different design corresponding to a type of the vehicle. An electric circuit formed on the circuit board 100 can be divided into multiple blocks in accordance with their functions. When the circuit board 100 is the meter board having various designs, the electric circuit formed on the circuit board 100 can be divided into two blocks, which are an individual circuit block and a common circuit block. A conductor pattern of the individual circuit block as a design circuit block can be changed easily in accordance with the design of the meter board. Another conductor pattern of the common circuit block as a fixed circuit block can be used commonly without depending on the design of the meter board. For example, in the meter board, the common circuit block is composed of a control circuit block, a power source block and the like. The control circuit block processes and controls the meter board on the basis of measurement results. The individual circuit board includes an indicator circuit block composed of a motor for driving an indicator needle and an illumination lamp for the indicator. The indicator needle indicates the processed measurement results outputted from the control circuit block. Specifically, the meter board has many types of design, and further, the design of the meter board is changed frequently. Accordingly, the control block having the function of processing and controlling the measurement results composes the common circuit block, and the indicator circuit block having the function of indicating the processed measurement results composes the individual circuit block. Therefore, the man-hour for designing is reduced.

In the above case, the conductor pattern corresponding to the individual circuit block as the indicator circuit block is formed on the flexible circuit board 1a, and the conductor pattern corresponding to the common circuit block as the control circuit block is formed on the printed circuit board 2a. Thus, the electric circuit formed in the circuit board 100 is classified into the individual circuit block and the common circuit block so that the conductor patterns of the electric circuit are divided into the individual circuit block and the common circuit block. Thus, the common circuit block having the common conductor pattern without depending on the design of the meter board is standardized to only a few kinds of the printed circuit board 2a in accordance with a scale of a processor and/or a controller for processing and controlling measurement results. Further, an inspection of properties of the common circuit block formed in the printed circuit board 2a can be standardized.

In the meter board for the vehicle, even when the indicator circuit block, i.e., the individual circuit block is large, the circuit board 100 can be manufactured at low cost. Here, when the indicator circuit block becomes larger, the flexible circuit board 1a also becomes larger. Further, when the conductor pattern of the electric circuit is changed so that the design of the meter board is changed, only the conductor pattern formed on the flexible circuit board 1a in the individual circuit block is changed. Thus, the design change can be easily performed by only changing the conductor pattern of the flexible circuit board. Accordingly, the man-hour for designing the circuit positioning is reduced; and therefore, the meter board, the design of which is changed, can be manufactured in a short period.

Figure 8A:
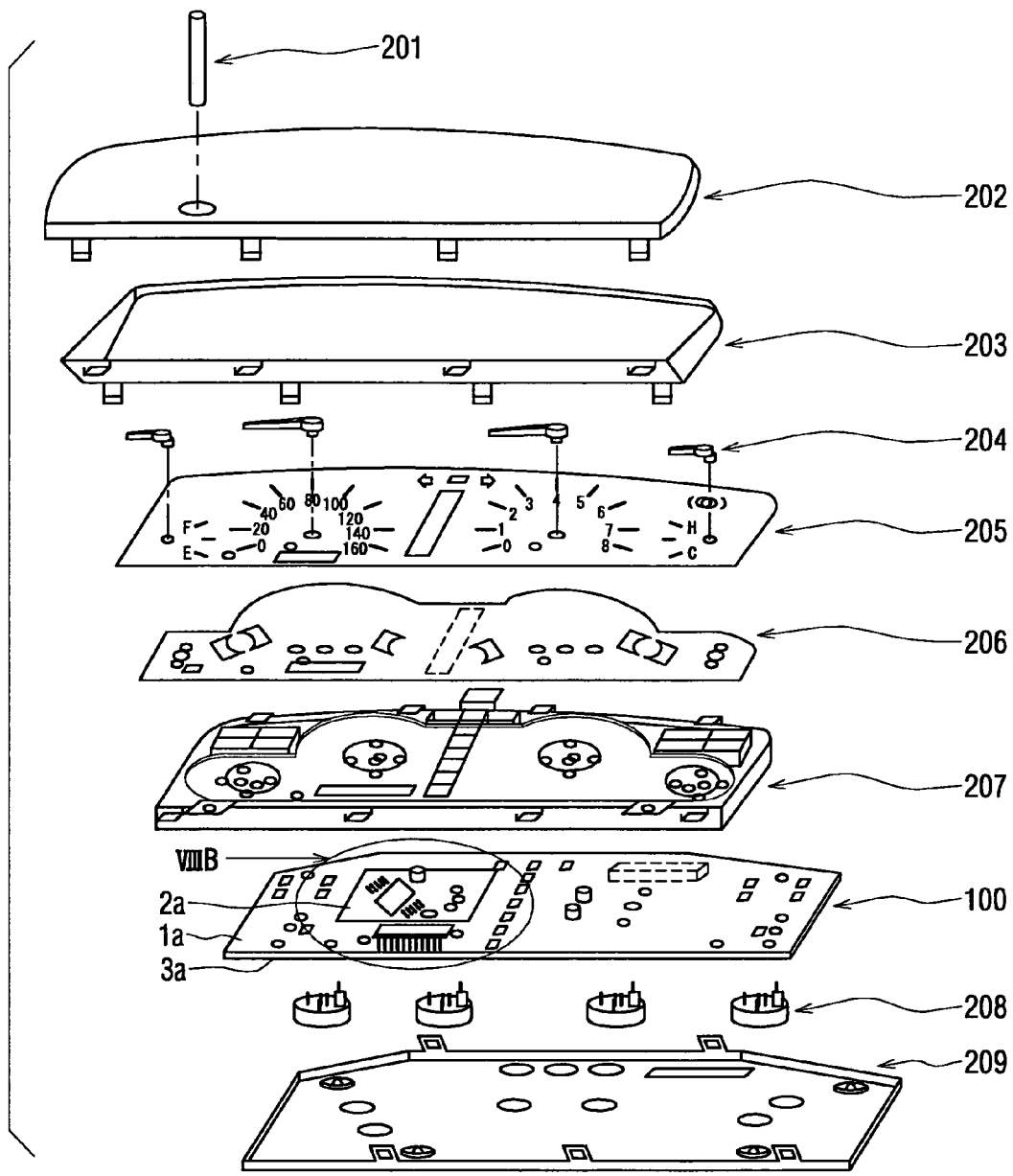
FIG. 8A is an exploded perspective view showing a combination meter including the circuit board according to the first embodiment.
Figure 8B:
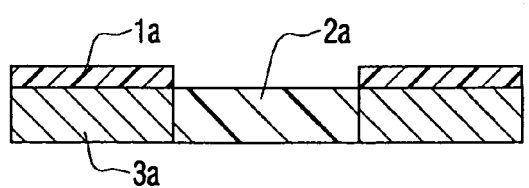
FIG. 8B is a partial cross sectional view showing a part of the circuit board VIIIB in FIG. 8A.

A combination meter for the vehicle having the circuit board 100 is, for example, shown in FIG. 8A and 8B. FIG. 8A is an exploded perspective view showing the combination meter. The combination meter includes a lever 201, a transparent cover 202, an upper exterior cover 203, an indicator needle 204, a dial plate 205, a lens 206, a casing 207, the circuit board 100, a motor 208 for driving the indicator needle 204, and a lower exterior cover 209. They are assembled in this order. When the design of the combination meter is changed, only the flexible circuit board 1a is changed. Further, although the flexible circuit board 1a is a large circuit board, the flexible circuit board is a single layer circuit board so that the manufacturing cost of the circuit board 100 is reduced. Further, the complicated electric circuit is disposed in the printed circuit board 2a, which is common and standardized so that the man-hour for designing the circuit positioning is reduced. Furthermore, the flexible circuit board 1a and the printed circuit board 2a thermally contact the metallic plate 3a so that the circuit board 100 has excellent heat conductivity and high rigidity.

(Second Embodiment)

Figure 2A:
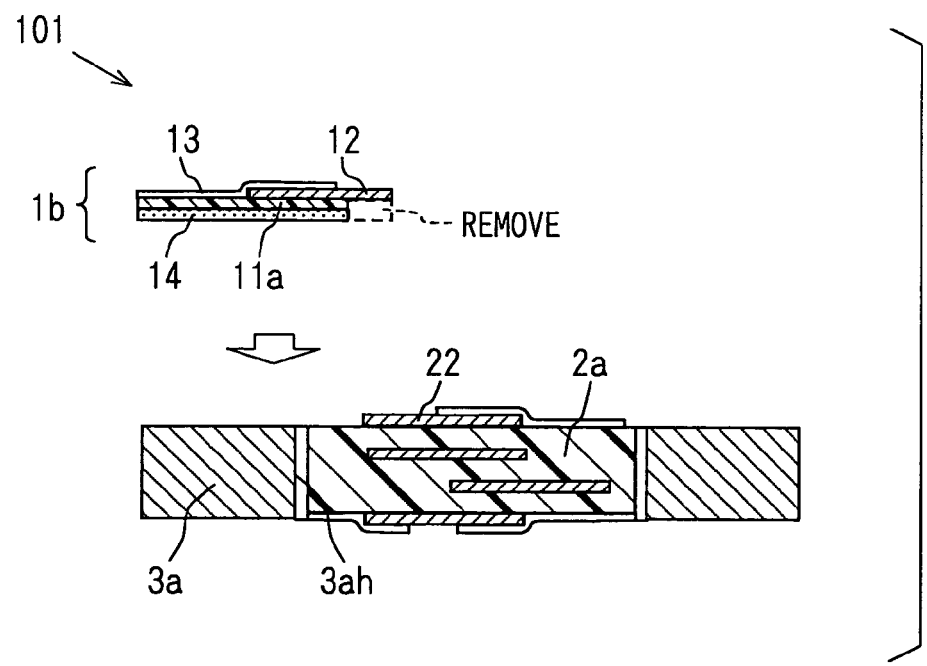
FIG. 2A is an exploded cross sectional view showing a circuit board.
Figure 2B:
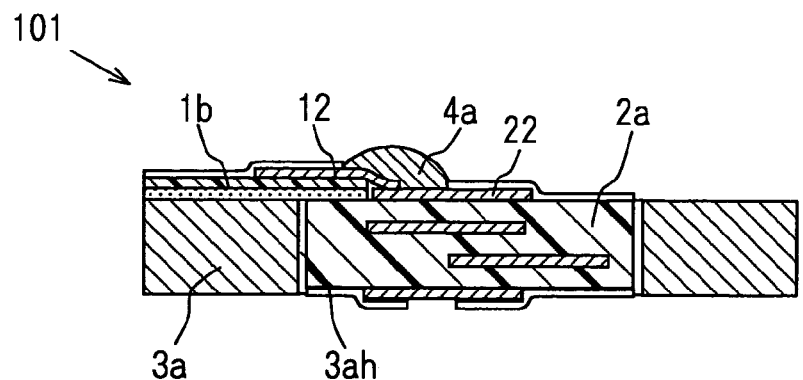
FIG. 2B is a cross sectional view showing the circuit board according to a second embodiment of the present invention.

A circuit board 101 according to a second embodiment of the present invention is shown in FIGS. 2A and 2B. In the circuit board 101, a part of the film base 11a and a part of the adhesion layer 14, which are disposed under the land 12 of the flexible circuit board 1b, are removed partially by a laser beam irradiation or the like. The part of the film base 11a and the part of the adhesion layer 14 correspond to a connection portion of the land 22 of the printed circuit board 2a. Thus, the step between the lands 12, 22 of the flexible circuit board 1b and the printed circuit board 2a is much reduced. Specifically, as shown in FIG. 2B, the land 12 of the flexible circuit board 1b almost contacts the land 22 of the printed circuit board 2a so that they are bonded with the solder 4a easily and tightly.

In the circuit board 101, no additional member is disposed between the lands 12, 22, so that the solder 4a is prevented from separating up and down when the lands 12, 22 are soldered. Thus, the lands 12, 22 are strongly and reliably bonded with the solder 4a so that the reliability of the connection between the lands 12, 22 is improved.

(Third Embodiment)

Figure 3A:
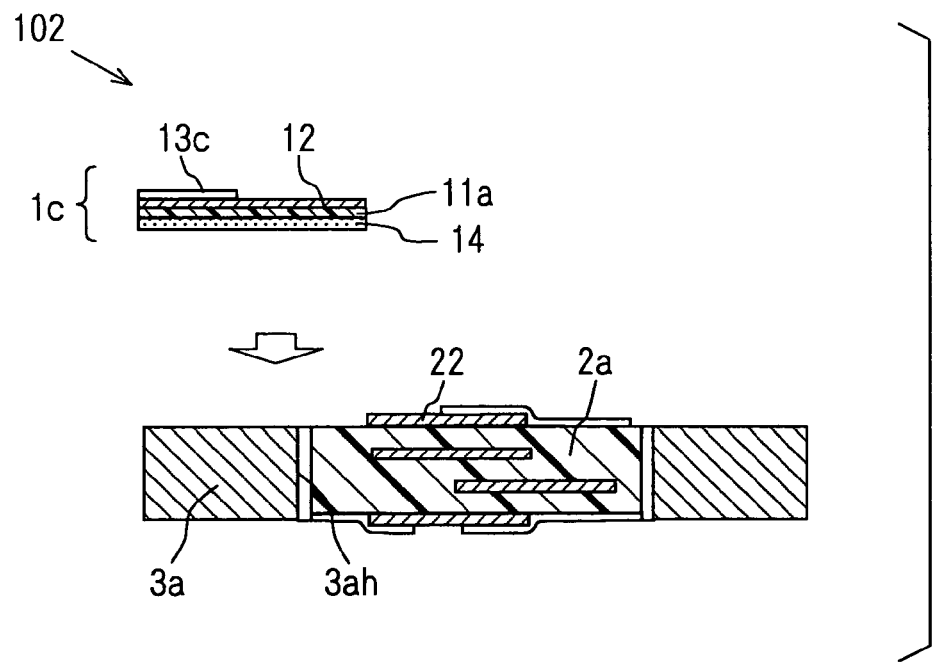
FIG. 3A is an exploded cross sectional view showing a circuit board.
Figure 3B:
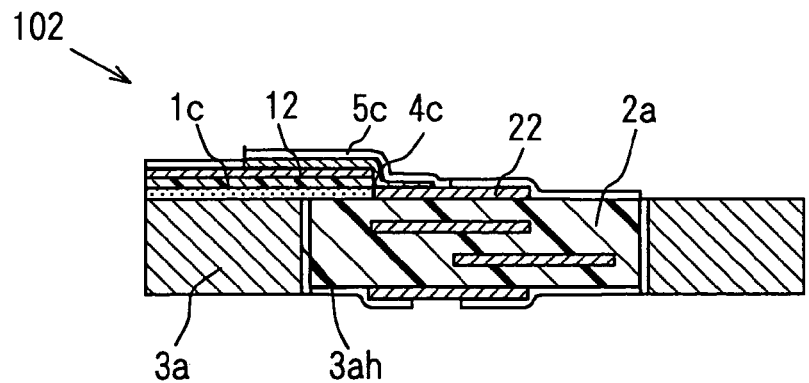
FIG. 3B is a cross sectional view showing the circuit board according to a third embodiment of the present invention.

A circuit board 102 according to a third embodiment of the present invention is shown in FIGS. 3A and 3B. In the circuit board 102, the lands 12, 22 are bonded with a conductive paste 4c. The conductive paste 4c is capable of connecting and bonding the lands 12, 22 finely.

When the lands 12, 22 are bonded with the conductive paste 4c, it is preferred that the step between the lands 12, 22 becomes smaller as much as possible. Accordingly, the land 12 of the flexible circuit board 1c, the film base 11a, the adhesion layer 14, the land 22 of the printed circuit board 2a are disposed on the metallic plate 3a and the printed circuit board 2a without overlapping together. The conductive paste 4c is printed or transferred on the lands 12, 22 after the flexible circuit board 1a is bonded to the printed circuit board 2a with the metallic plate 3a. Preferably, to reduce the influence of the step, the thickness of the conductive paste 4c is equal to or thicker than 8 µm. The conductive paste 4c is formed of a silver (i.e., Ag) paste, a copper (i.e., Cu) paste or the like. A resist layer 13c is formed on the land 12 of the flexible circuit board 1c. Another resist layer 5c is formed on the conductive paste 4c. The resist layers 13c, 5c work as an insulator.

In the circuit board 102, the lands 12, 22 are strongly and reliably bonded with the conductive paste 4c so that the reliability of the connection between the lands 12, 22 is improved.

(Fourth Embodiment)

Figure 4A:
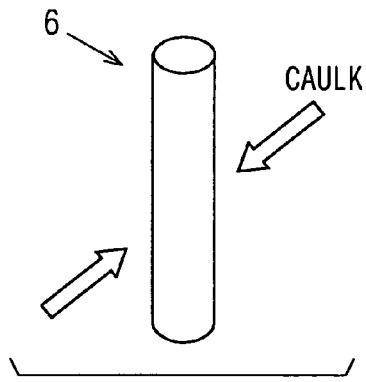
FIG. 4A is a perspective view showing a metallic pin before caulking.
Figure 4B:
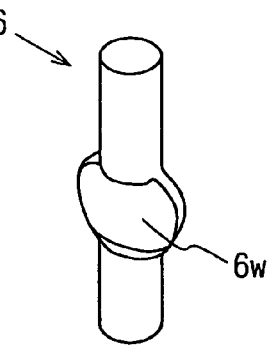
FIG. 4B is a perspective view showing the metallic pin after caulking.
Figure 4C:
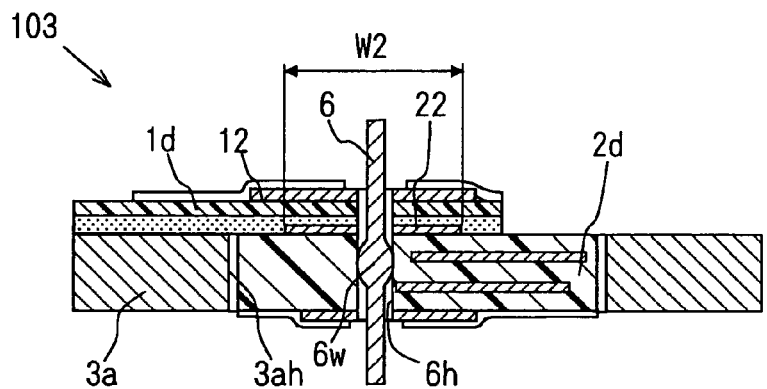
FIG. 4C is a cross sectional view showing a circuit board before soldering.

A circuit board 103 according to a fourth embodiment of the present invention is shown in FIGS. 4A to 4D. In the circuit board 103, the lands 12, 22 are connected with a metallic pin 6. FIG. 4A shows the metallic pin 6 before the pin 6 is caulked. FIG. 4B shows the metallic pin 6 having a flat portion 6w, which is formed by a caulking method, and is disposed at the center of the pin 6. FIG. 4C shows the circuit board 103, in which the metallic pin 6 is inserted in a through hole 6h.

Specifically, the flat portion 6w having wide width is formed by the caulking method so that the center of the metallic pin 6 is partially pressed and expanded. Thus, the center of the pin 6 is thinned and expanded. The caulking method provides the flat portion 6w at low cost.

As shown in FIG. 4C, in the circuit board 103, the land 12 of the flexible circuit board 1d and the land 22 of the printed circuit board 2d are overlapped so that an overlapping portion W2 is formed. The through hole 6h is formed at the overlapping portion W2 in the flexible circuit board 1d and the printed circuit board 2d. The metallic pin 6 is inserted in the through hole 6h. The flat portion 6w of the metallic pin 6 has a width, which is a little larger than the width of the through hole 6h. The metallic pin 6 having the flat portion 6w is press-inserted into the through hole 6h of the printed circuit board 2d. Thus, the metallic pin 6 is fixed to the printed circuit board 2d by the flat portion 6w. Accordingly, the flexible circuit board 1d and the printed circuit board 2d are easily bonded with a connecting member, i.e., the solder 4a in a later process.

Figure 4D:
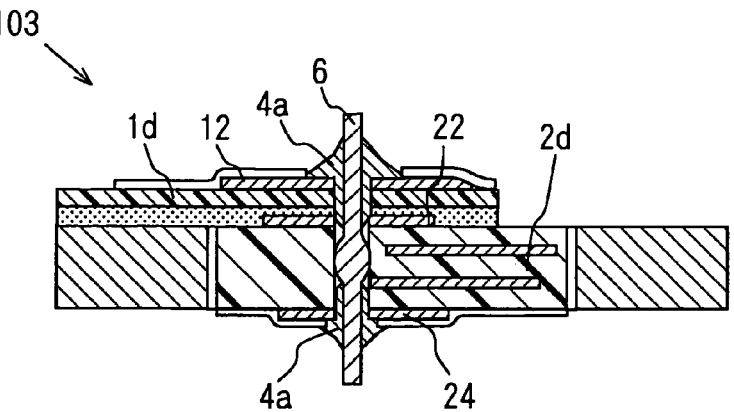
FIG. 4D is a cross sectional view showing the circuit board after soldering, according to a fourth embodiment of the present invention.

As shown in FIG. 4D, the land 12 of the flexible circuit board 1d and the land 22 of the printed circuit board 2d are electrically bonded with the solder 4a through the metallic pin 6. The metallic pin 6 inserted in the through hole 6h provides to connect between the lands 12, 22 electrically. Further, the metallic pin 6 provides to position the flexible circuit board 1d and the printed circuit board 2d precisely. Furthermore, the metallic pin 6 provides to fix the printed circuit board 2d inserted in the opening 3ah of the metallic plate 3a. Further, although the second land 24 of the printed circuit board 2d is disposed opposite to the land 12 of the flexible circuit board 1d, the second land 24 can be connected to the land 12 of the flexible circuit board 1d.

(Fifth Embodiment)

Figure 5A:
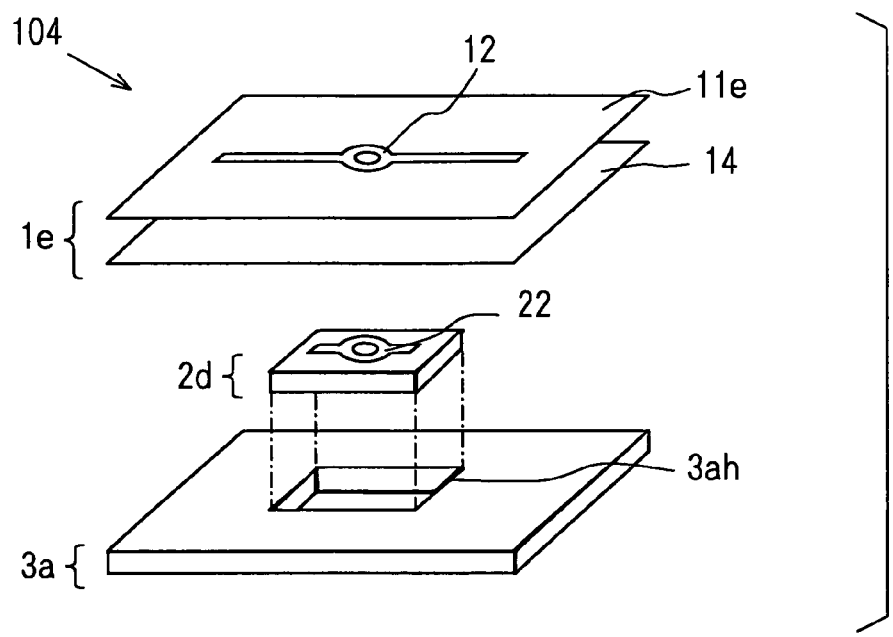
FIG. 5A is an exploded cross sectional view showing a circuit board according to a fifth embodiment of the present invention.
Figure 5B:
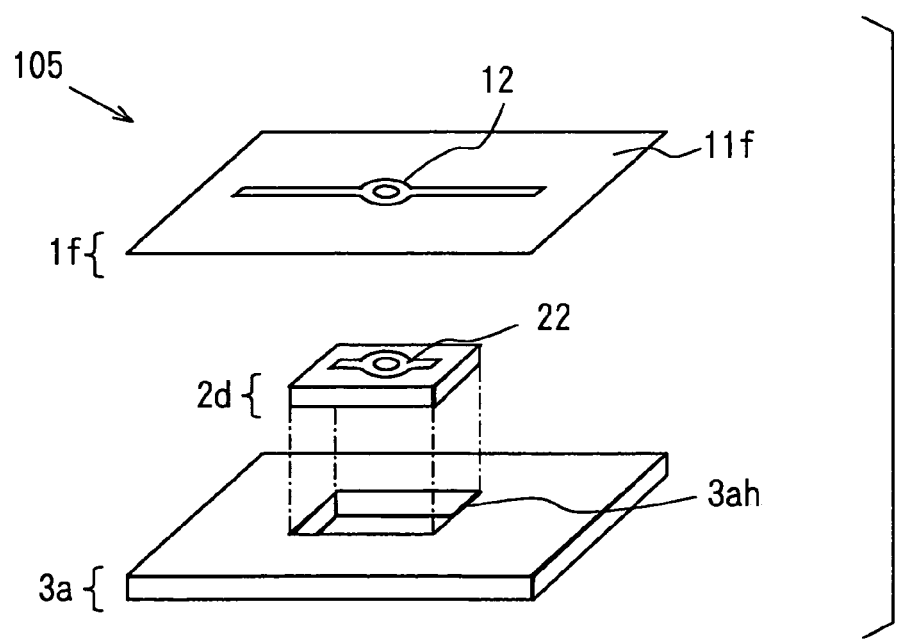
FIG. 5B is an exploded cross sectional view showing another circuit board according to a modification of the fifth embodiment.

A circuit board 104 according to a fifth embodiment of the present invention is shown in FIG. 5A. Another circuit board 105 according to a modification of the fifth embodiment of the present invention is shown in FIG. 5B. In the circuit board 104, a film base 11e of a flexible circuit board 1e is made of thermosetting resin. In the circuit board 105, a film base 11f of a flexible circuit board 1f is made of thermoplastic resin such as PEEK (i.e., poly ether ether ketone) and LCP (i.e., liquid crystal polymer). In this case, the film base 11f is heated so that the film base 11f is softened and becomes adhesive. Therefore, the film base 11f is capable of bonding to other materials. Accordingly, the circuit board 105 is laminated, pressurized and heated so that the metallic plate 3a, the printed circuit board 2d and the flexible circuit board 1f are bonded together without adhesion layer 14.

(Sixth Embodiment)

Figure 6:
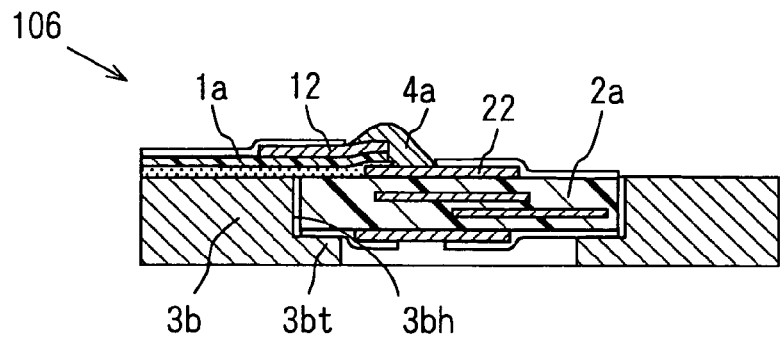
FIG. 6 is a cross sectional view showing a circuit board according to a sixth embodiment of the present invention.

A circuit board 106 according to a sixth embodiment of the present invention is shown in FIG. 6. In the circuit board 106, the printed circuit board 2a is mounted on a metallic plate 3b. The thickness of the metallic plate 3b is thicker than that of the printed circuit board 2a. The metallic plate 3b includes a protrusion 3bt for supporting the printed circuit board 2a so that the metallic plate 3b has a step construction. The protrusion 3bt is disposed on an opening 3bh of the metallic plate 3b, and opposite to the flexible circuit board 1a. The protrusion 3bt is formed in the metallic plate 3b by a press working method or the like before the printed circuit board 2a is inserted into the opening 3bh of the metallic plate 3b. The printed circuit board 2a is sandwiched between the flexible circuit board 1a and the protrusion 3bt of the metallic plate 3b so that the printed circuit board 2a is fixed. Thus, the protrusion 3bt compensates the adhesive force of the adhesion layer 14 so that the printed circuit board 2a is securely mounted and fixed in the opening 3bh of the metallic plate 3b.

(Seventh Embodiment)

Figure 7A:
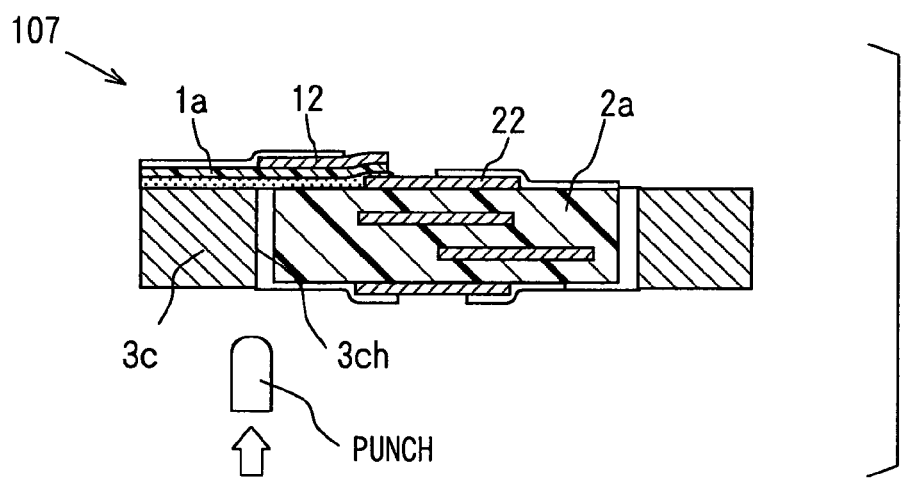
FIG. 7A is a cross sectional view showing a circuit board before punching.
Figure 7B:
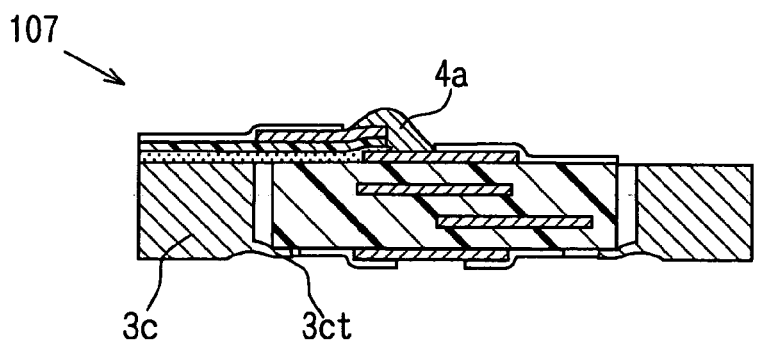
FIG. 7B is a cross sectional view showing the circuit board after punching, according to a seventh embodiment of the present invention.

A circuit board 107 according to a seventh embodiment of the present invention is shown in FIGS. 7A and 7B. The circuit board 107 includes a protrusion 3ct of a metallic plate 3c. The protrusion 3ct supports the printed circuit board 2a. The protrusion 3ct is formed around an opening 3ch of the metallic plate 3c by a deforming method such as a caulking method. Specifically, the deforming method is performed such that a periphery of the metallic plate 3c disposed around the opening 3ch is deformed by a punch so that the protrusion 3ct having a hook is formed after the printed circuit board 2a is inserted into an opening 3ch of the metallic plate 3c. Thus, the protrusion 3ct can be formed by the deforming method such as a punching method with using the punch so that a manufacturing cost of the protrusion 3ct is low.

Such changes and modifications are to be understood as being within the scope of the present invention as defined by the appended claims.

What is claimed is:

1. A circuit board comprising:
   a metallic plate having an opening, a first surface and a second surface, wherein the first surface is opposite to the second surface, and wherein the opening penetrates from the first surface to the second surface;
   a flexible circuit board disposed on the first surface of the metallic plate; and
   a printed circuit board disposed in the opening of the metallic plate,
   wherein the flexible circuit board is protruded to the opening of the metallic plate so that a part of the flexible circuit board is connected to the printed circuit board,
   wherein the printed circuit board includes a first land as a part of a conductor pattern, the first land disposed on a first surface of the printed circuit board, which is disposed on the first surface of the metallic plate,
   wherein the flexible circuit board includes a second land as a part of a conductor pattern, the second land disposed on a first surface of the flexible circuit board, which is opposite to the metallic plate, and
   wherein the first and second lands are electrically connected each other with a connecting member.

2. The circuit board according to claim 1, wherein the printed circuit board includes a multi-layered conductor pattern.

3. The circuit board according to claim 1, wherein the flexible circuit board includes a single-layered conductor pattern.

4. The circuit board according to claim 1, wherein the first surface of the metallic plate and the first surface of the printed circuit board are disposed on almost the same plane.

5. The circuit board according to claim 1, wherein the first and second lands are overlapped each other in a vertical direction perpendicular to the metallic plate so that an overlapping portion is provided.

6. The circuit board according to claim 5,
   wherein the overlapping portion includes a through hole, which penetrates through the flexible circuit board and the printed circuit board, and
   wherein the connecting member includes a metal pin, which is disposed in the through hole.

7. The circuit board according to claim 6,
   wherein the metal pin includes a wide width portion having a width a slight wider than a width of the through hole, and
   wherein the wide width portion is capable of inserting into the through hole so that the metal pin is mounted in the through hole.

8. The circuit board according to claim 7,
   wherein the wide width portion of the metal pin is disposed at a center of the metal pin, and
   wherein the wide width portion is provided in such a manner that the center of the metal pin is partially pressed and thinned.

9. The circuit board according to claim 1,
   wherein the flexible circuit board further includes a film base and an adhesion layer,
   wherein the film base is made of thermosetting resin,
   wherein the second land of the flexible circuit board is disposed on a first surface of the film base, and
   wherein the adhesion layer for laminating the flexible circuit board on the metallic plate with the printed circuit board is disposed on a second surface of the film base, which is opposite to the first surface of the flexible circuit board.

10. The circuit board according to claim 9, wherein the film base and the adhesion layer are partially removed at a connecting portion between the first and second lands so that the first and second lands are disposed on almost the same plane.

11. The circuit board according to claim 9, wherein the film base is made of poly imide, poly ethylene-2,6-naphthalene dicarboxylate, or poly ethylene telephthalate).

12. The circuit board according to claim 1, wherein the printed circuit board is made of glass epoxy resin.

13. The circuit board according to claim 1,
wherein the flexible circuit board further includes a film base,
wherein the film base is made of thermosetting resin, and
wherein the second land of the flexible circuit board is disposed on a first surface of the film base.

14. The circuit board according to claim 1, wherein the connecting member is a solder.

15. The circuit board according to claim 1, wherein the connecting member is a conductive paste.

16. The circuit board according to claim 1,
wherein the metallic plate further includes a protrusion, which is disposed in the opening of the metallic plate and opposite to the flexible circuit board, and
wherein the protrusion is capable of supporting the printed circuit board.

17. The circuit board according to claim 16, wherein the protrusion is provided in such a manner that a periphery of the metallic plate around the opening is deformed to be a hook.

18. The circuit board according to claim 1,
wherein the circuit board provides a plurality of electric circuits, which are classified with functions so that the electric circuits are divided into a plurality of blocks including an individual circuit block and a common circuit block,
wherein the individual circuit block has a conductor pattern of the electric circuits, which is changeable in accordance with a design of the circuit board,
wherein the common circuit block has a common conductor pattern of the electric circuits, which is common even when the design of the circuit board is changed,
wherein the flexible circuit board provides the individual circuit block, and
wherein the printed circuit board provides the common circuit block.

19. The circuit board according to claim 18,
wherein the common circuit block includes a control circuit block for processing a measurement result of a meter board, and
wherein the individual circuit block includes an indicating circuit block for indicating a processed measurement result.

20. The circuit board according to claim 19, wherein the meter board is used for an automotive vehicle.

21. The circuit board according to claim 20, wherein the meter board is a combination meter.

22. The circuit board according to claim 1, wherein the entirely of the printed circuit board is accommodated in the opening of the metallic plate.

23. The circuit board according to claim 22, wherein the printed circuit board has a thickness almost equal to that of the metallic plate.

24. The circuit board according to claim 22, wherein the printed circuit board has dimensions almost equal to those of the metallic plate.

25. The circuit board according to claim 22, wherein the printed circuit board is a multi-layered printed circuit board.

26. The circuit board according to claim 22, wherein the printed circuit board is inserted into the opening of the metallic plate.

27. The circuit board according to claim 22, wherein the printed circuit board contacts the metallic plate in order to provide thermal conductivity.

28. The circuit board according to claim 1, wherein the printed circuit board, except for the first land, is accommodated inside of the opening of the metallic plate.

29. The circuit board according to claim 1, the printed circuit board further includes a second surface, which is opposite to the first surface of the printed circuit board, the first surface of the printed circuit board is disposed inside of the opening of the metallic plate, and the second surface of the printed circuit board is disposed inside of the opening of the metallic plate.

30. The circuit board according to claim 29, the first surface of the printed circuit board and the first surface of the metallic plate are substantially disposed in a same plane, and the second surface of the printed circuit board and the second surface of the metallic plate are substantially disposed in another same plane.

* * * * *